United States Patent
Takada

(10) Patent No.: US 11,567,421 B2
(45) Date of Patent: Jan. 31, 2023

(54) SIGNAL GENERATION CIRCUIT AND IMAGE FORMING APPARATUS

(71) Applicant: TOSHIBA TEC KABUSHIKI KAISHA, Tokyo (JP)

(72) Inventor: Kazumasa Takada, Numazu Shizuoka (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 172 days.

(21) Appl. No.: 17/172,907

(22) Filed: Feb. 10, 2021

(65) Prior Publication Data
US 2021/0278779 A1  Sep. 9, 2021

(30) Foreign Application Priority Data
Mar. 6, 2020  (JP) ............................. JP2020-038414

(51) Int. Cl.
G03G 15/043  (2006.01)
G03G 15/04  (2006.01)
G03G 15/00  (2006.01)
H03L 7/08  (2006.01)

(52) U.S. Cl.
CPC ..... *G03G 15/043* (2013.01); *G03G 15/04045* (2013.01); *G03G 15/50* (2013.01); *G03G 2215/0402* (2013.01); *H03L 7/08* (2013.01)

(58) Field of Classification Search
CPC .......... G03G 15/043; G03G 15/04045; G03G 15/50; G03G 2215/0402; G03G 15/04054; G03G 15/04063; G03G 21/1882; H03L 7/08
See application file for complete search history.

(56) References Cited

U.S. PATENT DOCUMENTS

2009/0168097 A1* 7/2009 Tsuchida .............. G03G 15/326 358/1.15

FOREIGN PATENT DOCUMENTS

| JP | 2002108041 A | 4/2002 |
|---|---|---|
| JP | 2006088588 A | 4/2006 |
| JP | 2007098772 A | 4/2007 |
| JP | 2007125785 A | 5/2007 |

\* cited by examiner

*Primary Examiner* — Susan S Lee
(74) *Attorney, Agent, or Firm* — Kim & Stewart LLP

(57) ABSTRACT

According to an embodiment, a signal generation circuit includes a generation unit configured to generate a second clock signal from division of a first clock signal and generate a timing signal with a cycle length that is a sum of a predetermined number of half-cycle periods of the second clock signal. A period changing unit of the signal generation circuit is configured to adjust the cycle length of the timing signal by changing a length of at least one half-cycle period of the second clock signal. An output unit of the signal generation circuit is configured to output the second clock signal and the timing signal.

20 Claims, 11 Drawing Sheets

FIG. 12

| T1 | | | | | | | | |
|---|---|---|---|---|---|---|---|---|
| FINE ADJUSTMENT RATE | % | 0 | 0.001 | 0.002 | | 0.558 | 0.559 | 0.56 |
| INTERNAL FREQUENCY f_c | MHz | 120 | 120.0012 | 120.0024 | | 120.6696 | 120.6708 | 120.672 |
| SYNC_CLK FREQUENCY f_s | MHz | 20 | 20.0002 | 20.0004 | | 20.1116 | 20.1118 | 20.112 |
| SYNC_CLK RESOLUTION | μsec | 0.05 | 0.05 | 0.049999 | | 0.049723 | 0.049722 | 0.049722 |
| PROCESS SPEED v | mm/s | 215 | 215 | 215 | | 215 | 215 | 215 |
| RESOLUTION r | dpi | 2400 | 2400 | 2400 | | 2400 | 2400 | 2400 |
| INTERVAL d | μm | 10.58333 | 10.58333 | 10.58333 | | 10.58333 | 10.58333 | 10.58333 |
| SYNC CYCLE IDEAL VALUE h_i | μs | 49.22481 | 49.22481 | 49.22481 | | 49.22481 | 49.22481 | 49.22481 |
| SYNC CYCLE RESOLUTION | % | 0.101575 | 0.101574 | 0.101573 | | 0.101011 | 0.10101 | 0.101009 |
| SETTING VALUE n_B | dec | 984 | 985 | 985 | | 990 | 990 | 990 |
| SYNC CYCLE h | μs | 49.2 | 49.24951 | 49.24902 | | 49.22532 | 49.22483 | 49.22434 |
| ERROR e_p | % | 0.050419 | -0.05016 | -0.04916 | | -0.00105 | -5.5E-05 | 0.00094 |
| DRUM INTERVAL (BETWEEN Y AND K) | mm | 270 | 270 | 270 | | 270 | 270 | 270 |
| DRUM INTERVAL | LINE | 25511.81 | 25511.81 | 25511.81 | | 25511.81 | 25511.81 | 25511.81 |
| DRUM INTERVAL (ROUNDING OFF) | LINE | 25512 | 25512 | 25512 | | 25512 | 25512 | 25512 |
| COLOR SHIFT AMOUNT g | μm | -136.133 | 135.421 | 132.722 | | 2.833 | 0.147993 | -2.537 |

FIG. 13

| T2 | | | | | | | | | |
|---|---|---|---|---|---|---|---|---|---|
| FINE ADJUSTMENT RATE | % | 0 | -0.001 | -0.002 | | -0.151 | -0.152 | -0.153 | |
| INTERNAL FREQUENCY f_c | MHz | 120 | 119.9988 | 119.9976 | | 119.8188 | 119.8176 | 119.8164 | |
| SYNC_CLK FREQUENCY f_s | MHz | 20 | 19.9998 | 19.9996 | | 19.9698 | 19.9696 | 19.9694 | |
| SYNC_CLK RESOLUTION | μ sec | 0.05 | 0.050001 | 0.050001 | | 0.050076 | 0.050076 | 0.050077 | |
| PROCESS SPEED v | mm/s | 215 | 215 | 215 | | 215 | 215 | 215 | |
| RESOLUTION r | dpi | 2400 | 2400 | 2400 | | 2400 | 2400 | 2400 | |
| INTERVAL d | μ m | 10.58333 | 10.58333 | 10.58333 | | 10.58333 | 10.58333 | 10.58333 | |
| SYNC CYCLE IDEAL VALUE h_i | μ s | 49.22481 | 49.22481 | 49.22481 | | 49.22481 | 49.22481 | 49.22481 | |
| SYNC CYCLE RESOLUTION | % | 0.101575 | 0.101576 | 0.101577 | | 0.101728 | 0.101729 | 0.101730 | |
| SETTING VALUE n_B | dec | 984 | 984 | 984 | | 983 | 983 | 983 | |
| SYNC CYCLE h | μ s | 49.2 | 49.20049 | 49.20098 | | 49.22433 | 49.22482 | 49.22531 | |
| ERROR e_p | % | 0.050419 | 0.049419 | 0.048418 | | 0.00097 | -3.2E-05 | -0.00103 | |
| DRUM INTERVAL (BETWEEN Y AND K) | mm | 270 | 270 | 270 | | 270 | 270 | 270 | |
| DRUM INTERVAL | LINE | 25511.81 | 25511.81 | 25511.81 | | 25511.81 | 25511.81 | 25511.81 | |
| DRUM INTERVAL (ROUNDING OFF) | LINE | 25512 | 25512 | 25512 | | 25512 | 25512 | 25512 | |
| COLOR SHIFT AMOUNT g | μ m | -136.133 | -133.431 | -130.73 | | -2.619 | 0.08517 | 2.7893 | |

SIGNAL GENERATION CIRCUIT AND IMAGE FORMING APPARATUS

CROSS-REFERENCE TO RELATED APPLICATION

This application is based upon and claims the benefit of priority from Japanese Patent Application No. 2020-038414, filed on Mar. 6, 2020, the entire contents of which are incorporated herein by reference.

FIELD

Embodiments described herein relate to a signal generation circuit and an image forming apparatus.

BACKGROUND

There is a print head in which a plurality of light emitting elements, such as light-emitting diodes (LEDs) or organic electro-luminescence (EL), are arranged. Such a print head is used for an electrophotographic printer. As one type of such a print, there is a CLK synchronous print head. The CLK synchronous print head uses a clock signal ("transfer CLK") and a light emission start timing signal ("SYNC") for transferring image data, and another clock signal ("SYNC_CLK") for adjusting light emission time. The CLK synchronous print head has an upper limit for the SYNC_CLK frequency that can be input due to restrictions related to the operation speed of amounted integrated circuit (IC), power consumption, heat generation, and the like. However, the lower the SYNC_CLK frequency is kept, the larger the shift from an ideal value of a SYNC cycle, and thus, a color shift amount also increases.

BRIEF DESCRIPTION OF THE DRAWINGS

FIG. 12 is a diagram illustrating an example of a table for determining a setting value and an internal CLK frequency.

FIG. 13 is a diagram illustrating another example of a table for determining a setting value and an internal CLK frequency.

DETAILED DESCRIPTION

Figure 1:
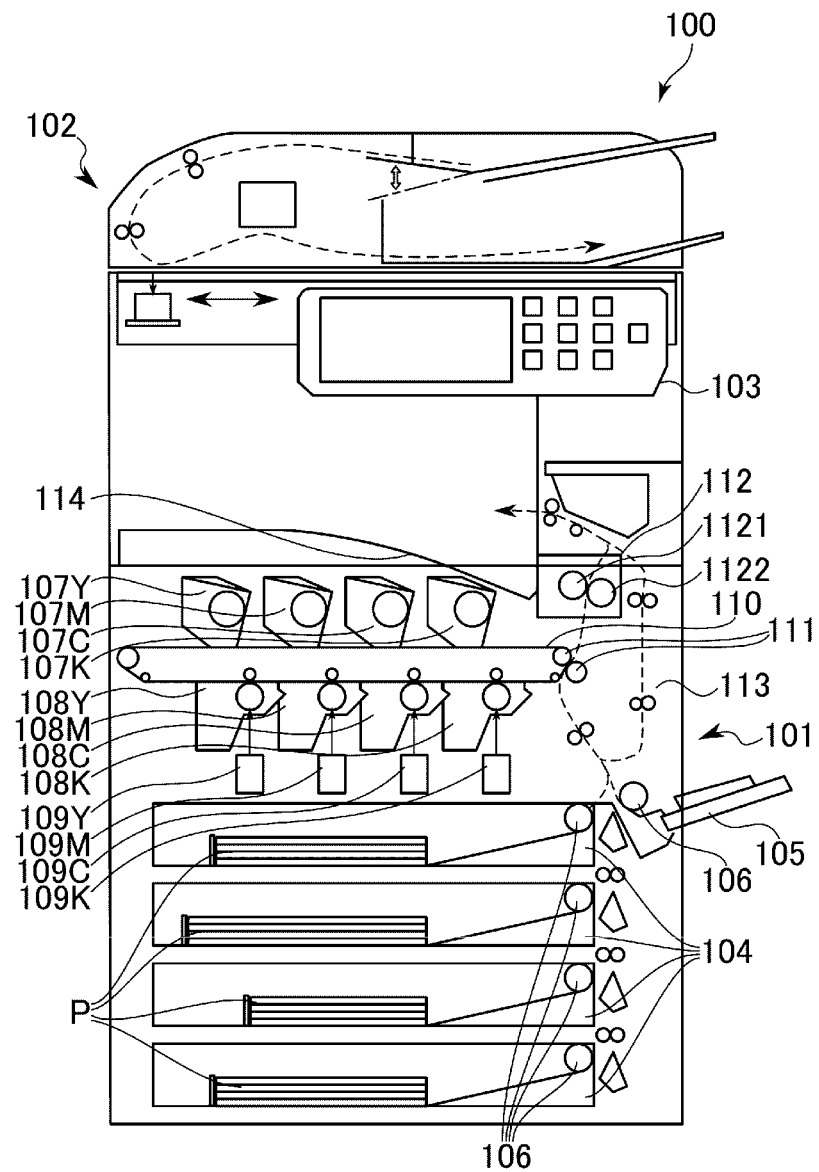
FIG. 1 depicts an image forming apparatus according to a first embodiment and a second embodiment.

A problem to be solved by an embodiment is to provide a signal generation circuit and an image forming apparatus that can bring the SYNC cycle close to an ideal value without increasing the frequency of the SYNC_CLK signal.

According to one embodiment, a signal generation circuit includes a generation unit that is configured to generate a second clock signal from division of a first clock signal and generate a timing signal with a cycle length that is a sum of a predetermined number of half-cycle periods of the second clock signal. A period changing unit of the signal generation circuit is configured to adjust the cycle length of the timing signal by changing a length of at least one half-cycle period of the second clock signal. An output unit of the signal generation circuit is configured to output the second clock signal and the timing signal.

Hereinafter, image forming apparatuses according to certain example embodiments will be described with reference to the drawings. In the drawings, scale and dimensions of respective portions may be changed as appropriate. Further, in the drawings, some aspects and/or components may be omitted for the sake of clarity. Furthermore, in the drawings and the present specification, the same reference numerals denote elements that are the same or substantially so.

First Embodiment

FIG. 1 depicts an image forming apparatus 100 according to a first embodiment.

The image forming apparatus 100 is, for example, a multifunction peripheral (MFP), a copy machine, a printer, a facsimile, or the like. However, the image forming apparatus 100 will be described below as an MFP. The image forming apparatus 100 has, for example, a print function, a scan function, a copy function, a facsimile function, and the like. The print function is a function of forming an image on an image forming medium P or the like by using toner or the like. The image forming medium P is, for example, a sheet of paper or the like. The scan function is a function of reading an image from a document or the like. The copy function is a function of printing an image read from a document or the like by first using the scan function to acquire image data then printing the image on the image forming medium P by using the print function. The image forming apparatus 100 includes, for example, a printer 101, a scanner 102, and an operation panel 103.

The printer 101 has the print function. The printer 101 includes paper feed trays 104, a manual feed tray 105, paper feed rollers 106, toner cartridges 107, image forming units 108, print heads 109, a transfer belt 110, secondary transfer rollers 111, a fixing unit 112, a duplex unit 113, and a paper discharge tray 114.

The scanner 102 reads an image from a document. The scanner 102 is, for example, an optical reduction system including an imaging device such as a charge-coupled device (CCD) image sensor. Alternatively, the scanner 102 is a contact image sensor (CIS) system including an imaging device such as a complementary metal-oxide-semiconductor (CMOS) image sensor. Alternatively, the scanner 102 may be any other known system.

The operation panel 103 includes a man-machine interface that permits the input and output of information between the image forming apparatus 100 and an operator of the image forming apparatus 100. The operation panel 103 includes, for example, buttons and a touch panel for the operator to operate. The touch panel is formed by stacking a display such as a liquid crystal display or an organic EL display and a pointing device detecting a touch input. Therefore, the buttons and the touch panel function as an input device that can be operated by the operator. The display included in the touch panel functions as a display device that notifies the operator of various types of information.

The paper feed trays 104 each contain image forming media P used for printing.

The manual feed tray 105 is a table for manually feeding an image forming medium P.

The paper feed rollers 106 each rotate according to an action of a motor to unload an image forming medium P from a paper feed tray 104 or the manual feed tray 105.

The toner cartridges 107Y, 107M, 107C, 107K store toner and the like to be supplied to the respective image forming unit 108Y, 108M, 108C, 108K. In the present embodiment, the image forming apparatus 100 includes the four toner cartridges: a toner cartridge 107C, a toner cartridge 107M, a toner cartridge 107Y, and a toner cartridge 107K, as illustrated in FIG. 1. The toner cartridge 107C, the toner cartridge 107M, the toner cartridge 107Y, and the toner cartridge 107K each respectively store toner corresponding to one color of cyan, magenta, yellow, and black (CMYK). Colors of the toner stored in the toner cartridges are not limited to the respective CMYK colors and may be other colors. Additionally, the number of toner cartridges may be any number of one or more.

The image forming apparatus 100 includes the four image forming units: an image forming unit 108C, an image forming unit 108M, an image forming unit 108Y, and an image forming unit 108K as illustrated in FIG. 1. The image forming unit 108C, the image forming unit 108M, the image forming unit 108Y, and the image forming unit 108K each form an image with toner corresponding to one color of CMYK. In other examples, the number of image forming units may be any number of one or more.

Figure 2:
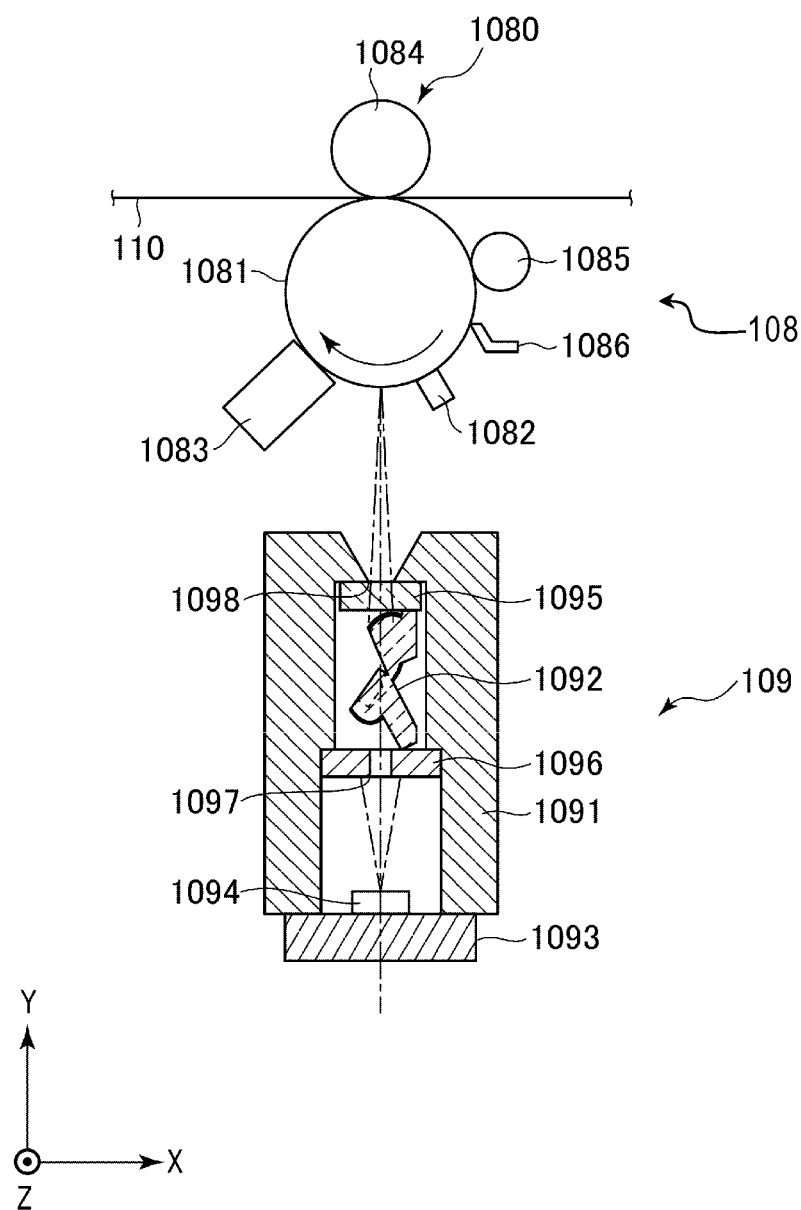
FIG. 2 is an enlarged schematic view of an image forming unit, a print head, and a peripheral structure thereof.

The image forming apparatus 100 includes one or more print head 109 (see FIG. 2). For example, the image forming apparatus 100 includes the four print heads: a print head 109C, a print head 109M, a print head 109Y, and a print head 109K, as illustrated in FIG. 1. The print head 109C, the print head 109M, the print head 109Y, and the print head 109K each correspond to one color of CMYK.

The print heads 109Y, 109M, 109C, 109K each form electrostatic latent images on the corresponding image forming units 108Y, 108M, 108C, 108K by supplying exposure light based on image signals of corresponding color components in the image data to be printed.

The transfer belt 110 is, for example, an endless belt and is rotatable by an action of a roller. The transfer belt 110 rotates to convey the images transferred from the respective image forming units 108Y, 108M, 108C, 108K to the secondary transfer rollers 111.

The image forming units 108Y, 108M, 108C, 108K and the print heads 109Y, 109M, 109C, 109K will be further described with reference to FIG. 2. FIG. 2 is an enlarged schematic view of one of image forming units 108Y, 108M, 108C, 108K, a corresponding one of the print heads 109Y, 109M, 1089, 109K, and peripheral structures thereof. In general, since each image forming unit 108Y, 108M, 108C, 108K is structurally similar to each other image forming unit 108, the following description will refer to an image forming unit 108 to indicate each image forming unit (108Y, 108M, 108C, 108K) is being described. Similarly, the following description will refer to a print head 109 to indicate each print head (109Y, 109M, 109C, 109K) is being described. FIG. 2 illustrates coordinate axes X, Y, and Z of an orthogonal coordinate system. Each image forming unit 108 includes a photoconductive drum 1081, an electrification charger 1082, a development device 1083, a primary transfer roller 1084, a cleaner 1085, and a blade 1086.

The photoconductive drum 1081 is a roller that is disposed such that an outer peripheral surface is in contact with the transfer belt 110 and is rotatable around a rotation axis parallel to the Z axis. The photoconductive drum 1081 rotates in the arrow direction (clockwise direction) in FIG. 2 at the same circumferential speed as the transfer belt 110 by a drive mechanism. The photoconductive drums 1081 of adjacent image forming units 108 are separated by, for example, 90 mm. This distance is a distance between the centers of the adjacent photoconductive drums 1081. Therefore, the photoconductive drum 1081 of the image forming unit 108Y and the photoconductive drum 1081 of the image forming unit 108K are separated by, for example, 270 mm.

The electrification charger 1082 uniformly charges the surface of the photoconductive drum 1081.

The development device 1083 supplies toner of a corresponding color to the electrostatic latent image formed on the surface of the photoconductive drum 1081. Thereby, the development device 1083 forms a toner image on the surface of the photoconductive drum 1081.

The primary transfer roller 1084 is located at a position facing the photoconductive drum 1081 with the transfer belt 110 interposed therebetween. A transfer voltage (bias) is generated between the primary transfer roller 1084 and the photoconductive drum 1081. Thereby, the primary transfer roller 1084 transfers (referred to as a primary transfer) the toner image formed on the surface of the photoconductive drum 1081 to the transfer belt 110 The primary transfer roller 1084 of each of the image forming units 108 the toner image of the respective color to the transfer belt 110 in an overlapping manner.

The cleaner 1085 and the blade 1086 remove toner remaining on the surface of the photoconductive drum 1081.

The print head 109 is attached to, for example, a position directly below the photoconductive drum 1081. The print head 109 includes, for example, a lens mirror array 1092, a support 1091, a substrate 1093, a light source 1094, a protective glass 1095, and a light blocking member 1096.

The support 1091 has, for example, a rectangular block shape. The support 1091 extends in the Z direction, which is parallel to a rotation axis of the photoconductive drum 1081, and is at a position separated from but facing a lower portion of the photoconductive drum 1081. The support 1091 supports the lens mirror array 1092, the substrate 1093, the light source 1094, the protective glass 1095, and the light blocking member 1096.

The lens mirror array 1092 is made of, for example, transparent resin or glass. The lens mirror array 1092 has a structure in which a plurality of transparent optical elements having the same shape are arranged along the Z direction and integrated with each other. Each of these optical elements includes a lens and a mirror. The lens mirror array 1092 reflects and collects incident light from the light source 1094 by using a lens and a mirror and then directs the light toward the surface of the photoconductive drum 1081.

The substrate 1093 is a circuit substrate (e.g., a printed circuit board) on which the light source 1094, a drive circuit for driving the light source 1094, and the like are mounted.

The light source 1094 is, for example, a source in which a plurality of semiconductor light emitting elements are arranged on a surface of the substrate 1093 in the Z direction and are mounted in a line. Rows of the plurality of semiconductor light emitting elements can be arranged side by side along the Z direction. The light source 1094 is an example of a light emitting unit.

The light sources 1094 of the respective print heads 109 emit light based on the image data (an image signal) corresponding to corresponding color components in the image data. The image data in this context can be image data acquired by a document reading apparatus 10 or image data acquired by an external device such as a personal computer (PC). The image data is decomposed into the different color components for use by the different light sources 1094. The plurality of semiconductor light emitting elements of the light source 1094 are turned on or off based on the image data. The plurality of semiconductor light emitting elements of the light source 1094 are, for example, light emitting diodes (LEDs), organic light emitting diodes (OLEDs) or the like.

The protective glass 1095 is provided between the lens mirror array 1092 and the photoconductive drum 1081. The protective glass 1095 is transparent glass, transparent resin, or the like. The protective glass 1095 prevents toner, dust, and the like from adhering to the lens mirror array 1092. The protective glass 1095 also serves to position one end of the lens mirror array 1092 by abutting thereon. The protective glass 1095 extends in the Z direction.

The light blocking member 1096 is provided between the lens mirror array 1092 and the light source 1094. The light blocking member 1096 extends in the Z direction and includes a slit 1097 also extending in the Z direction. For example, a surface of the light blocking member 1096 is coated with a light blocking material or anti-reflective material. The light blocking member 1096 blocks some part of the light emitted from the light source 1094. For example, the light blocking member 1096 blocks the light that passes through a position separated from an optical axis by a predetermined distance or more.

Further, the support 1091 includes a slit 1098 extending in the Z direction on a light emission side of the protective glass 1095. The slit 1098 has a width allowing light components necessary for light exposure to pass therethrough but blocks noise light that is unnecessary for the light exposure.

The light emitted from the light source 1094 passes through the slit 1097 of the light blocking member 1096 and is then incident on the lens mirror array 1092. The lens mirror array 1092 reflects and collects the light from the light source 1094. The light emitted from the lens mirror array 1092 is focused on the surface of the rotating photoconductive drum 1081 through the protective glass 1095 and the slit 1098.

At this time, one line, extending in the Z direction, of the electrostatic latent image is formed on the surface of the photoconductive drum 1081. By repeating this, all the lines of the electrostatic latent image can be formed, one by one, on the surface of the photoconductive drum 1081 with a slight rotation in the circumferential direction between each line. Then, after the photoconductive drum 1081 rotates by a certain amount, an electrostatic latent image of one of the color components corresponding to the entire image of a document has been formed on the surface of the photoconductive drum 1081.

Description returns to FIG. 1.

The secondary transfer rollers 111 include two rollers facing each other. The secondary transfer rollers 111 transfer (referred to as a secondary transfer) the toner image formed on the transfer belt 110 onto the image forming medium P passing between the secondary transfer rollers 111.

The fixing unit 112 heats and presses the image forming medium P to which the toner image has been transferred. Thereby, the image transferred to the image forming medium P is fixed to the image forming medium P. The fixing unit 112 includes a heating unit 1121 and a pressure roller 1122 facing each other.

The heating unit 1121 is, for example, a roller including a heat source. The heat source is, for example, a resistive heater, a lamp, or the like.

Alternatively, the heating unit 1121 may include an endless belt suspended by a plurality of rollers. For example, the heating unit 1121 includes a plate-shaped heat source, an endless belt, a belt transport roller, a tension roller, and a press roller. The endless belt is, for example, a film-shaped member. The belt transport roller drives the endless belt. The tension roller tensions the endless belt. The press roller includes an elastic layer formed on a surface thereof. A heat generation portion side of the plate-shaped heat source is in contact with the inside of the endless belt and is pressed toward the press roller, and thus, a fixing nip having a predetermined width is formed between the press roller and the plate-shaped heat source. The heating unit 1121 is configured such that the plate-shaped heat source forms and heats a nip region, and thus, responsiveness when supplying power is higher than responsiveness of a heating method using a halogen lamp.

The pressure roller 1122 presses the image forming medium P passing between the pressure roller 1122 and the heating unit 1121.

The duplex unit 113 can be used for printing on the back side of the image forming medium P ready. For example, the duplex unit 113 reverses a front surface and a rear surface of the image forming medium P by switching back the image forming medium P by using rollers or the like.

The paper discharge tray 114 is a table to which the printed image forming medium P can be discharged.

Figure 3:
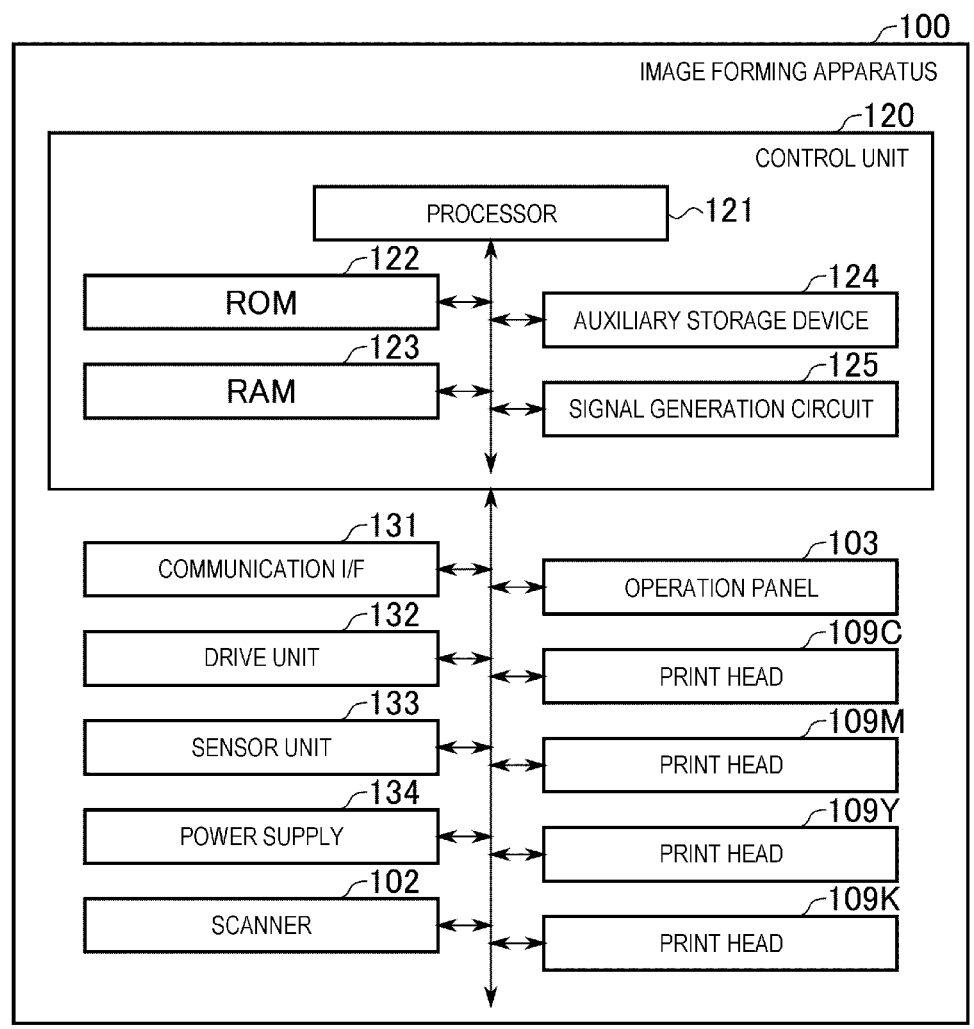
FIG. 3 is a block diagram of an image forming apparatus.

FIG. 3 is a block diagram of the image forming apparatus 100.

The image forming apparatus 100 includes, for example, a control unit 120, a communication I/F 131, a drive unit 132, a sensor unit 133, a power supply 134, the scanner 102, the operation panel 103, a print head 109C, a print head 109M, a print head 109Y, and a print head 109K.

The control unit 120 can be a hardware circuit or the like that performs controls and the like of respective units of the image forming apparatus 100. The control unit 120 can include, for example, a processor 121, a read-only memory (ROM) 122, a random-access memory (RAM) 123, an auxiliary storage device 124, and a signal generation circuit 125.

The processor 121 performs a process such as calculation and control necessary for an operation of the image forming apparatus 100. The processor 121 controls each unit to realize various functions of the image forming apparatus 100 based on programs such as firmware, system software, and application software stored in the ROM 122, the auxiliary storage device 124, or the like. Further, the processor 121 performs a process to be described below based on a program. A part or all of the function or operations of the described program may be incorporated into a circuit of the processor 121. The processor 121 is, for example, a central processing unit (CPU), a micro processing unit (MPU), a system on chip (SoC), a digital signal processor (DSP), a graphics processing unit (GPU), an application specific integrated circuit (ASIC), a programmable logic device (PLD), a field-programmable gate array (FPGA), or the like. Alternatively, the processor 121 is a combination of a plurality of such elements or components.

The ROM 122 is a non-volatile memory used only for reading data. The ROM 122 stores, for example, firmware and the like. Further, the ROM 122 also stores data and the like used by the processor 121 in performing various processes.

The RAM 123 is a memory that can be used for reading and writing data from and to. The RAM 123 is used as a work area by the processor 121 in performing various processes. The RAM 123 is a typical volatile memory.

The auxiliary storage device 124 is, for example, an electric erasable programmable read-only memory (EE-PROM), a hard disk drive (HDD), or a flash memory. The auxiliary storage device 124 stores, for example, system software, application software, and the like. The auxiliary storage device 124 retains data used by the processor 121 in performing various processes, data generated by a process of the processor 121, various setting values, and the like. The image forming apparatus 100 may include an interface into which a storage medium such as a memory card or a universal serial bus (USB) memory can be inserted, as the auxiliary storage device 124. The interface functions to read and write information from and to such a storage medium.

Figure 4:
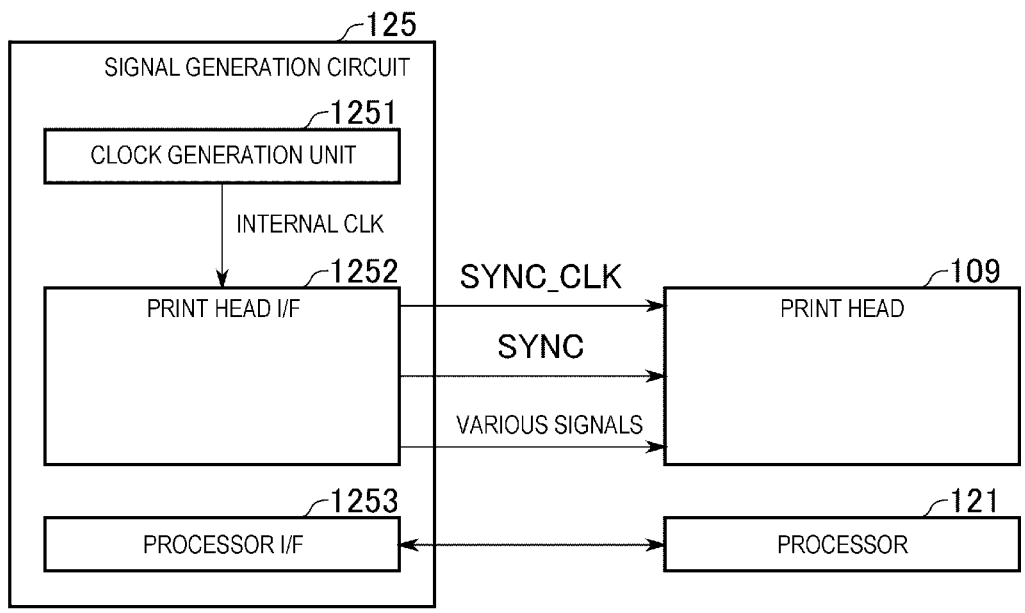
FIG. 4 is a block diagram depicting aspects related to a signal generation circuit according to the first embodiment.

FIG. 4 is a block diagram related to the signal generation circuit 125. The signal generation circuit 125 is, for example, an ASIC or the like. The signal generation circuit 125 generates a signal to be inputted to the print head 109. Further, the signal generation circuit 125 also sends a signal to the print head 109. The signal generation circuit 125 includes, for example, a clock generation unit 1251, a print head I/F 1252, and a processor I/F 1253. The signal generation circuit 125 also includes a circuit that performs image processing, a circuit that generates an image signal, and the like.

The clock generation unit 1251 generates a clock signal used for an operation of the signal generation circuit 125. The clock signal generated by the clock generation unit 1251 is hereinafter referred to as "internal CLK". The internal CLK is an example of a first clock signal.

The print head I/F 1252 is a circuit that generates digital signals such as SYNC and SYNC_CLK. The print head I/F 1252 is an interface that outputs SYNC, SYNC_CLK, and also various other signals. These signals are input to the print head 109. Therefore, the print head I/F 1252 is an example of an output unit that outputs SYNC and SYNC_CLK.

The print head I/F 1252 generates SYNC_CLK by dividing the internal CLK. Furthermore, the print head I/F 1252 generates SYNC based on SYNC_CLK and a setting value n. Generation of SYNC_CLK and SYNC, and the setting value n will be described in further detail below.

SYNC_CLK is an example of a second clock signal. SYNC is an example of a timing signal. Therefore, the print head I/F 1252 is an example of a generation unit that generates a second clock signal (SYNC_CLK) and a timing signal (SYNC).

The processor I/F 1253 is an interface for the signal generation circuit 125 to communicate with the processor 121. The signal generation circuit 125 receives an instruction from the processor 121 via the processor I/F 1253.

Description returns to FIG. 3.

The communication I/F 131 is an interface for the image forming apparatus 100 to perform communication via the Internet and a network such as a local area network (LAN).

The drive unit 132 is a circuit for driving a motor or the like to rotate a roller or rollers in the image forming apparatus 100.

The sensor unit 133 measures various possible states and the like of the image forming apparatus 100.

The power supply 134 supplies power to each unit of the image forming apparatus 100.

Figure 5:
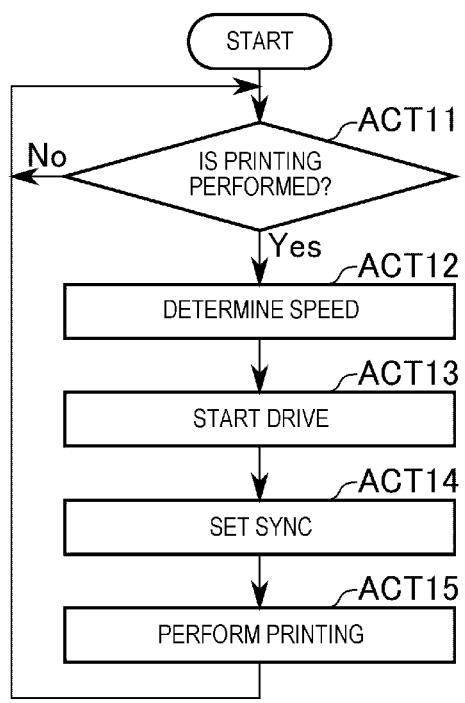
FIG. 5 is a flowchart illustrating an example of a process performed by a processor according to the first embodiment.

Hereinafter, an operation of the image forming apparatus 100 according to a first embodiment will be described with reference to FIG. 5. Content of a process in the following description on the operation is an example, and various processes that can obtain the same result can be appropriately used. FIG. 5 is a flowchart illustrating an example of a process performed by the processor 121 of the image forming apparatus 100, according to the first embodiment. The processor 121 performs this process based on a program stored in, for example, the ROM 122, the auxiliary storage device 124, or the like.

The processor 121 starts the process illustrated in FIG. 5, for example, when the image forming apparatus 100 starts up.

In Act 11 of FIG. 5, the processor 121 of the image forming apparatus 100 determines whether or not to perform printing. For example, the processor 121 determines that printing is to be performed based on a print job according to when the communication I/F 131 receives the print job from a PC, a server, or the like. Alternatively, the processor 121 determines that printing is to be performed according to when an input operation is received via the operation panel 103 instructing the performance of copying or printing. If printing is not to be performed, the processor 121 determines No in Act 11 and then returns (repeats) Act 11. If printing is to be performed, the processor 121 determines Yes in Act 11 and proceeds to Act 12.

In Act 12, the processor 121 determines a process speed ("process speed v") for printing. For example, the processor 121 determines the process speed v according to setting content, content of the print job, input operation content, or the like. For example, the processor 121 determines the process speed v according to the type of the image forming medium P being printed or the like.

In Act 13, the processor 121 controls the drive unit 132 to operate a motor or the like, thereby, driving the relevant roller (s) or the like at a speed set according to the process speed v determined in Act 12.

In Act 14, the processor 121 sets a SYNC cycle. Setting of the SYNC cycle will be described by taking a case of the following conditions as an example.

Internal CLK frequency f_c: 120 [MHz]
Division ratio N: 6
SYNC_CLK frequency f_s: 20 [MHz]
Process speed v: 215 [mm/sec]
Resolution r of sub-scan direction: 2400 [dpi]

An interval d, in the sub-scan direction, between lines formed on the image forming medium P is:

$$d=(1/r)[\text{in(inch)}]\approx 10.58333\ [\mu m] \quad (1)$$

In order to set the resolution in the sub-scan direction to r, the SYNC cycle may be set to an ideal value h_i. Here, the ideal value h_i is:

$$h\_i=(d/v)\approx 49.22481\ [\mu sec] \quad (2)$$

If the SYNC cycle can be set to h_i, the color shift that would otherwise be due to an error of SYNC does not occur.

Here, a cycle t of the internal CLK is:

$$t=(1/f\_c)\approx 0.00833 \text{ [μsec]} \tag{3}$$

The cycle t is the resolution of the SYNC cycle h in the first embodiment. That is, the SYNC cycle h will be a multiple of the cycle t. Therefore, h can be represented as follows:

$$h=(n\cdot t) \tag{4}$$

Here, the setting value n [dec] must be a natural number.

In order to set the SYNC cycle h to h_i, the corresponding setting value n is represented as follows:

$$n\_i=(h\_i/t)=5906.97 \tag{5}$$

However, the setting value n must be a natural number. Therefore, in order to bring the SYNC cycle h closest to h_i, n_i may be rounded to n=5907. In other words, $$n=\text{floor}((h\_i/t)+0.5)=5907 \tag{6}$$

Here, floor(x) indicates a floor function of a real number x. When n=5907, the cycle h becomes 49.225 [μsec], and an error e_L between the cycle h and the cycle h_i is:

$$e\_L=h-h\_i\approx -0.00019 \text{ [μsec]} \tag{7}$$

Further, an error e_p, which is a percentage error is as follows:

$$(1-(h/h\_i))\times 100\approx -0.00039[\%] \tag{8}$$

The processor 121 in this example calculates the setting value n as described above. However, the method by which the processor 121 calculates n is not limited to the above and any method may be used. The processor 121 sets the SYNC cycle by transmitting the calculated setting value n to the signal generation circuit 125.

The setting value n transmitted from the processor 121 is inputted to the signal generation circuit 125 via the processor I/F 1253. Further, the setting value n supplied to the signal generation circuit 125 is input to the print head I/F 1252.

Figure 6:
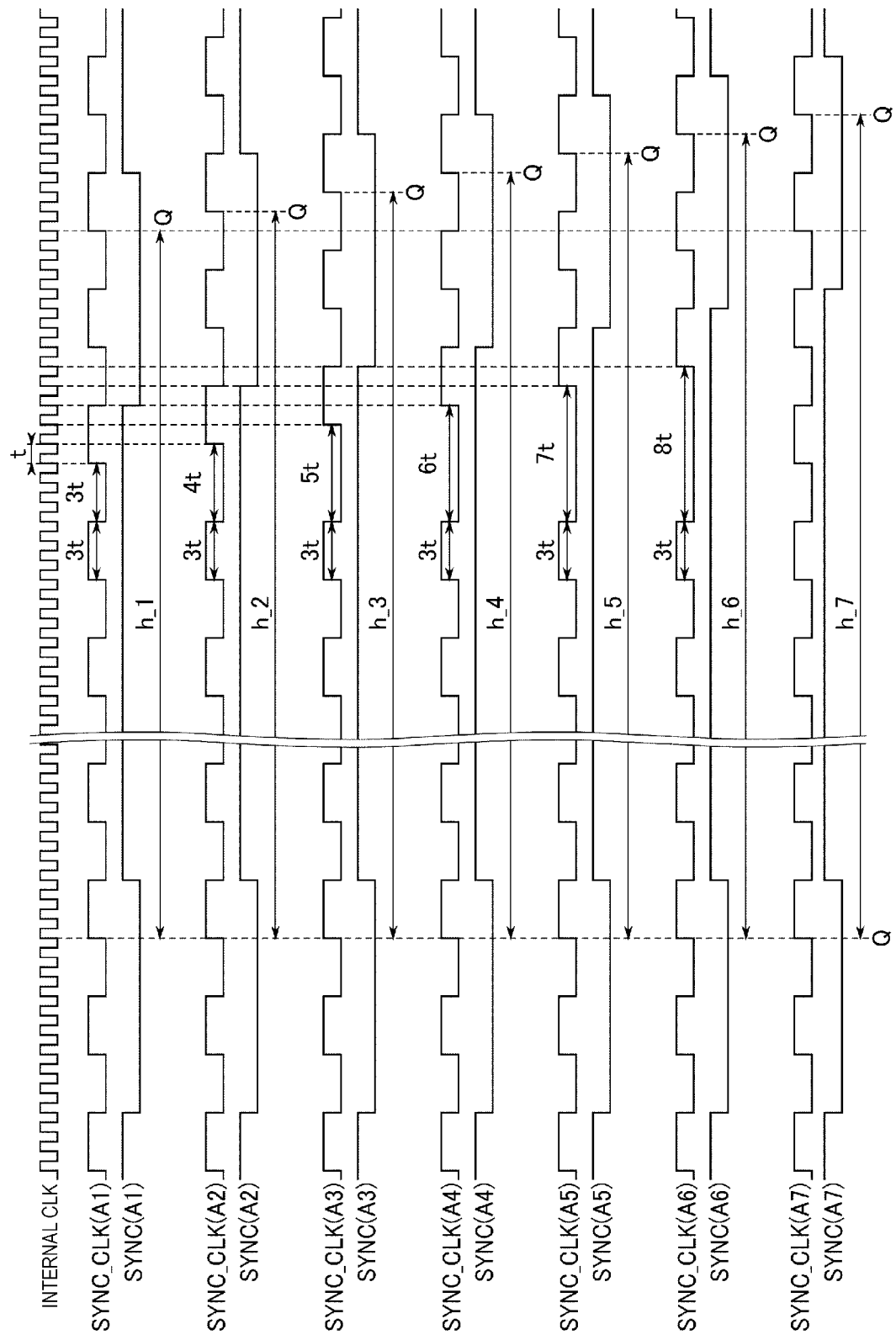
FIG. 6 is a timing chart illustrating examples of internal CLK, SYNC_CLK, and SYNC according to the first embodiment.

The print head I/F 1252 generates SYNC_CLK and SYNC based on the received setting value n. Examples of SYNC_CLK and SYNC will be described with reference to FIG. 6. FIG. 6 is a timing chart illustrating examples of the internal CLK, SYNC_CLK, and SYNC according to the first embodiment. FIG. 6 illustrates SYNC_CLK(A1) to SYNC_CLK(A7) and SYNC(A1) to SYNC(A7) as examples of SYNC_CLK and SYNC.

The print head I/F 1252 generates SYNC such that the cycle h of SYNC will be equal in length to a sum of cycles of SYNC_CLK that is k waves (half-cycle periods) long. However, k must be a natural number, where:

$$k=\text{floor}(n/N)=984 \tag{9}$$

Further, if n is represented in the form of:

$$n=N\cdot k+m \tag{10}$$

then m is as follows:

$$m=(n \bmod N)=n-N\cdot k=3 \tag{11}$$

Here, m is an integer of 0 or more. Further, "mod" in equation (11) indicates a modulo operator.

SYNC_CLK (A1) and SYNC(A1) show examples of SYNC_CLK and SYNC when n=N·k=6k.

SYNC_CLK (A2) and SYNC(A2) show examples of SYNC_CLK and SYNC when n=N·k+1=6k+1.

SYNC_CLK (A3) and SYNC(A3) show examples of SYNC_CLK and SYNC when n=N·k+2=6k+2.

SYNC_CLK (A4) and SYNC(A4) show examples of SYNC_CLK and SYNC when n=N·k+3=6k+3.

SYNC_CLK (A5) and SYNC(A5) show examples of SYNC_CLK and SYNC when n=N·k+4=6k+4.

SYNC_CLK (A6) and SYNC(A6) show examples of SYNC_CLK and SYNC when n=N·k+5=6k+5.

SYNC_CLK (A7) and SYNC(A7) show examples of SYNC_CLK and SYNC when n=N·k2=6k2. However, it is assumed here that k2=k+1. That is, SYNC_CLK (A7) and SYNC(A7) are SYNC_CLK when a value of k is greater than SYNC_CLK (A1) and SYNC(A1) by 1.

SYNC_CLK (A1) has a constant cycle length. Therefore, a cycle h_1 of SYNC(A1) is as follows:

$$h\_1=k(t\_s/2) \tag{12}$$

In contrast to this, for SYNC_CLK (A2) to SYNC_CLK (A6), the length of a period (hereinafter, referred to as an "L period") for which the level of the SYNC_CLK signal is low (L) is longer than the half cycle of SYNC_CLK for one cycle of SYNC. The value for cycle t_s of SYNC_CLK is as follows:

$$t\_s=(1/f\_s)=N\cdot t=6t=0.05 \text{ [μsec]} \tag{13}$$

Therefore, a half cycle (t_s/2) of SYNC_CLK is as follows:

$$t\_s/2=3t \tag{14}$$

For example, SYNC_CLK(A2) has an L period length of 4t for one cycle of SYNC as compared to 3t for all other cycles of SYNC. That is, SYNC_CLK(A2) has an (one) L period length longer than the half cycle (t_s/2) of SYNC_CLK by a time t once during a (one) cycle of SYNC. Furthermore, since the cycle of SYNC is equal to a total number of cycles of SYNC_CLK which are a multiple of k waves long, the cycle h_2 of SYNC(A2) is as follows:

$$h\_2=k(t\_s/2)+t \tag{15}$$

Note, that the term L period refers in this context to the length of time from when a signal level changes from H to L to when the signal level next changes from L to H.

The SYNC_CLK(A3) has an L period length of 5t once in one cycle of SYNC. Therefore, a cycle h_3 of SYNC(A3) is as follows:

$$h\_3=k(t\_s/2)+2t \tag{16}$$

The SYNC_CLK(A4) has an L period length of 6t once in a cycle of SYNC. Therefore, a cycle h_4 of SYNC(A4) is as follows:

$$h\_4=k(t\_s/2)+3t \tag{17}$$

SYNC_CLK(A5) has an L period length of 7t once in one cycle of SYNC. Therefore, a cycle h_5 of SYNC(A5) is as follows:

$$h\_5=k(t\_s/2)+4t \tag{18}$$

SYNC_CLK(A6) has an L period length of 8t once in one cycle of SYNC. Therefore, a cycle h_6 of SYNC(A6) is as follows:

$$h\_6=k(t\_s/2)+5t \tag{19}$$

When N=6 and n=5907, then k=984 and m=3. Therefore, when N=6 and n=5907, then SYNC_CLK and SYNC are SYNC_CLK(A4) and SYNC(A4).

As described above, the processor 121 performs a process of Act 14 ("Set Sync"), thereby, functioning as an example of a control unit that changes a cycle of SYNC according to a process speed.

Further, as described above, the print head I/F 1252 is an example of a period changing unit that changes the cycle of SYNC by changing the length of the L period.

In Act 15, the processor 121 performs printing based on a print job or the like. During printing, the print head I/F 1252 outputs SYNC_CLK and SYNC generated based on the setting performed in Act 14 and sends SYNC_CLK and SYNC to the print head 109. The print head 109 causes the light source 1094 to emit light using second H as a trigger in response to the SYNC_CLK becoming the second high (H) after becoming the L period. Thereby, the light source 1094 emits light for every cycle h of SYNC. By repeating this, the image forming apparatus 100 forms an image using the electrostatic latent image on the photoconductive drum 1081 as described above. Then, the image formed on the photoconductive drum 1081 is transferred onto the image forming medium P being conveyed at the process speed v. As such, the image forming apparatus 100 performs printing on the image forming medium P. Then, the image forming apparatus 100 discharges the printed image forming medium P to the paper discharge tray 114. FIG. 6 illustrates timing Q that triggers light emission. After the process of Act 15, the processor 121 returns to Act 11.

According to the image forming apparatus 100 of the first embodiment, the signal generation circuit 125 can change the length of the L period of SYNC_CLK by a time that is a multiple of the cycle t. Therefore, a resolution of the cycle h of SYNC in the signal generation circuit 125 according to the first embodiment is equal to the cycle t of the internal CLK. That is, the resolution of the cycle h of SYNC is approximately 0.00833 [µsec]. Further, as described above, the cycle h in the above embodiment is 49.225 [µsec]. Thus, the error e_L between the cycle h and the cycle h_i in this case is approximately −0.00019 [µsec], and the error e_p is approximately −0.00039 [%].

The photoconductive drum 1081 of the image forming unit 108Y and the photoconductive drum 1081 of the image forming unit 108K are separated by 270 [mm]. Since a line interval d is approximately 10.58333 [µm], 270 [mm] is a length corresponding to approximately 25511.81 lines. Therefore, 270 [mm] is a length of 25512 lines after rounding off. The color shift amount g for 25512 lines is as follows.

$$g = (d \cdot e\_p)/100 \times 25512 \approx 1.063 \, [\mu m] \quad (20)$$

In the image forming apparatus of the related art, the cycle of SYNC_CLK is fixed. Therefore, the resolution of the cycle of SYNC of the related art is equal to the cycle t_s of SYNC_CLK. That is, $$t\_s = (1/f\_s) = 6t = 0.05 \, [\mu sec] \quad (21)$$

Therefore, a cycle h_c of SYNC in the image forming apparatus of the related art is 49.2 [µsec]. Thus, an error e_Lc between the cycle h_c and the cycle h_i is approximately 0.02481 [µsec]. Further, an error e_pc, which is a percentage of this error, is approximately 0.050419 [%]. Therefore, a color shift amount g_c for 25512 lines is −136.13 [µm].

As described above, the signal generation circuit 125 according to the first embodiment has a higher resolution of the cycle h of SYNC and a smaller difference from an ideal value than the signal generation circuit of the related art having the same frequency f_s of SYNC_CLK. Thereby, the signal generation circuit 125 according to the first embodiment can reduce the color shift amount as compared with the related art. It can be seen from this that the color shift amount g of the first embodiment is less than the color shift amount g_c in the image forming apparatus of the related art.

The signal generation circuit 125 according to the first embodiment changes a cycle of SYNC by increasing a length of an L period in SYNC_CLK. An increase in the length of an L period in SYNC_CLK may be realized by a more simple circuit than would be required for shortening the length of the L period, and thus cost can be reduced.

The signal generation circuit 125 according to the first embodiment changes the cycle of SYNC by changing an L period length of SYNC_CLK just once for one cycle of SYNC. As such, the signal generation circuit 125 can change the resolution t of the cycle of SYNC by changing the length just once for one cycle.

The image forming apparatus 100 according to the first embodiment determines a setting value according to a process speed and sets a cycle of SYNC. Therefore, the image forming apparatus 100 according to the first embodiment can reduce the color shift amount even if the process speed is changed.

The first embodiment described above can be modified as follows.

Figure 7:
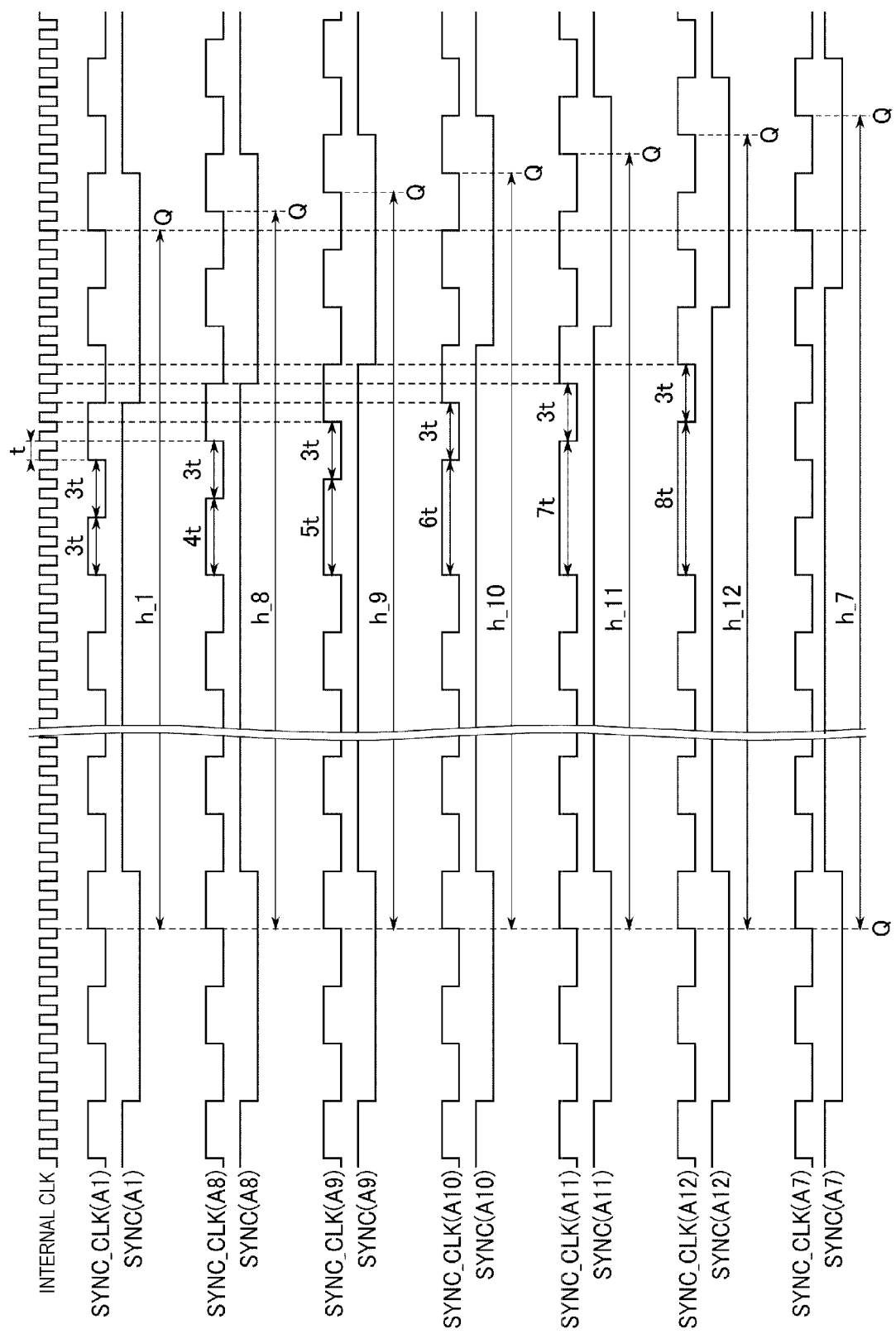
FIG. 7 is a timing chart illustrating examples of internal CLK, SYNC_CLK, and SYNC according to a modification example of the first embodiment.

In the first embodiment described above, the signal generation circuit 125 sets a length of a cycle h of SYNC by increasing a length of an L period in SYNC_CLK. However, the signal generation circuit 125 may instead set the length of the cycle h of SYNC by increasing a length of an H period in SYNC_CLK. In this context, an H period is the time period during which a signal level is a high (H) value. That is, the H period refers to the time period from when the signal level changes from L to H to when the signal level next changes from H to L. FIG. 7 illustrates examples of SYNC and SYNC_CLK when a length of an H period of SYNC_CLK is increased. FIG. 7 is a timing chart illustrating examples of internal CLK, SYNC_CLK, and SYNC according to a modification example of the first embodiment.

FIG. 7 illustrates SYNC_CLK(A1) and SYNC_CLK(A7) to SYNC_CLK(A12), and SYNC(A1) and SYNC(A7) to SYNC(A12) as examples of SYNC_CLK and SYNC.

SYNC_CLK (A8) and SYNC(A8) show examples of SYNC_CLK and SYNC when n=N·k+1=6k+1.

SYNC_CLK (A9) and SYNC(A9) show examples of SYNC_CLK and SYNC when n=N·k+2=6k+2.

SYNC_CLK(A10) and SYNC(A10) show examples of SYNC_CLK and SYNC when n=N·k+3=6k+3.

SYNC_CLK(A11) and SYNC(A11) show examples of SYNC_CLK and SYNC when n=N·k+4=6k+4.

SYNC_CLK(A12) and SYNC(A12) show examples of SYNC_CLK and SYNC when n=N·k+5=6k+5.

In SYNC_CLK(A8) to SYNC_CLK(A12), the length of an H period of SYNC_CLK is longer than a half cycle of SYNC_CLK just once in one cycle of SYNC.

The SYNC_CLK(A8) has an H period length of 4t once in one cycle of SYNC. Therefore, a cycle h_8 of SYNC(A8) is as follows:

$$h\_8 = k(t\_s/2) + t \quad (22)$$

SYNC_CLK(A9) has an H period length of 5t once in one cycle of SYNC. Therefore, a cycle h_9 of SYNC(A9) is as follows:

$$h\_9 = k(t\_s/2) + 2t \quad (23)$$

SYNC_CLK(A10) has an H period length of 6t once in one cycle of SYNC. Therefore, a cycle h_10 of SYNC(A10) is as follows:

$$h\_10 = k(t\_s/2) + 3t \quad (24)$$

SYNC_CLK(A11) has an H period length of 7t once in one cycle of SYNC. Therefore, a cycle h_11 of SYNC(A11) is as follows:

$$h\_11 = k(t\_s/2) + 4t \quad (25)$$

SYNC_CLK(A12) has an H period length of 8t once in one cycle of SYNC. Therefore, a cycle h_12 of SYNC(A12) is as follows:

$$h\_12 = k(t\_s/2) + 5t \quad (26)$$

When N=6 and n=5907, then k=984 and m=3. Therefore, when N=6 and n=5907, SYNC_CLK and SYNC illustrated in FIG. 7 are SYNC_CLK(A10) and SYNC(A10).

An increase in the length of the H period of SYNC_CLK can be realized by a more simple circuit than would otherwise be required for shortening the length of the H period, and thus cost can be reduced.

Figure 8:
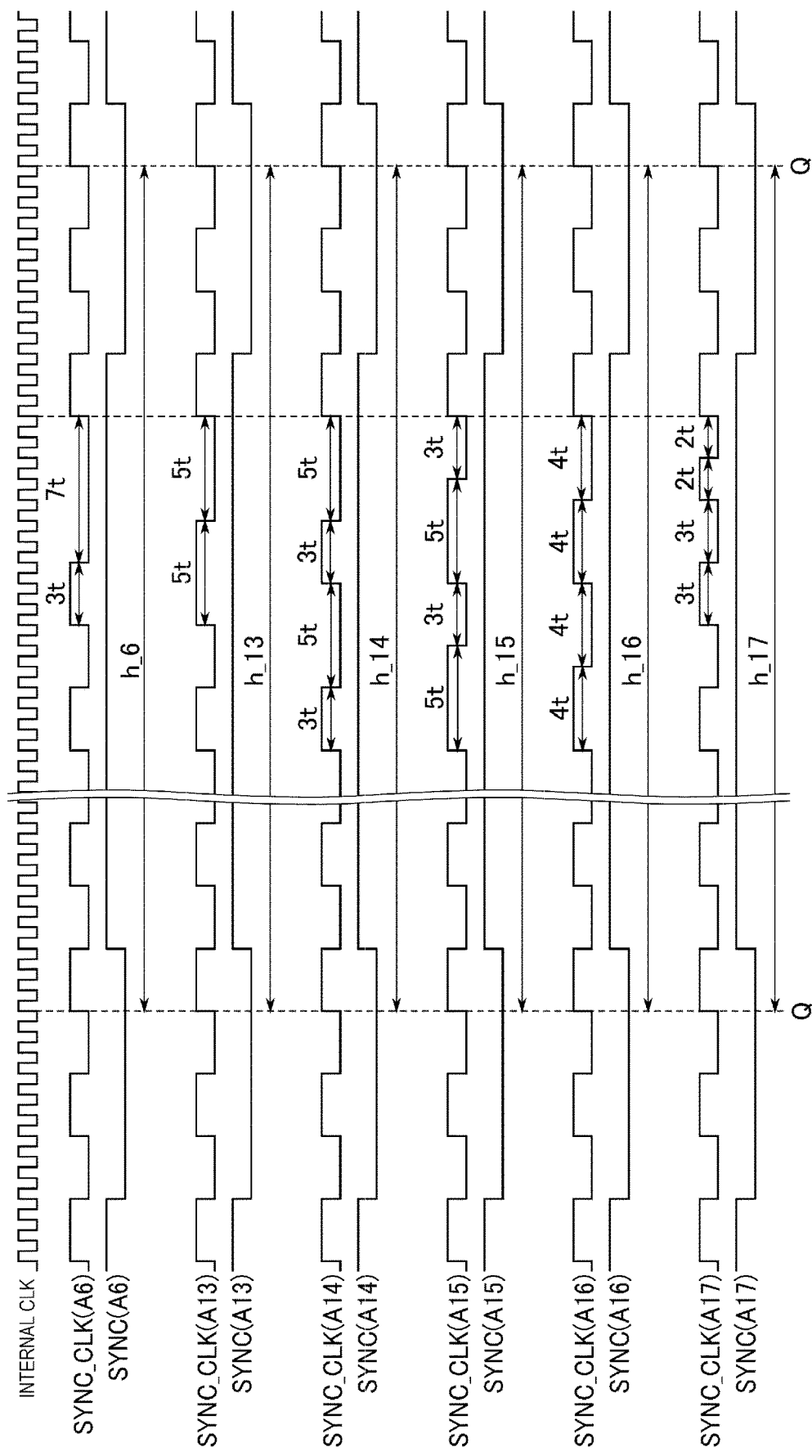
FIG. 8 is a timing chart illustrating another example of the internal CLK, SYNC_CLK, and SYNC according to another modification example of the first embodiment.

In the first embodiment described above, the signal generation circuit 125 sets a length of the cycle h of SYNC by increasing a length of the L period of SYNC_CLK just once for a cycle of SYNC. However, the signal generation circuit 125 may change the length of the H period or the L period twice or more in one cycle of SYNC. FIG. 8 illustrates examples of SYNC and SYNC_CLK in such a case. FIG. 8 is a timing chart illustrating examples of internal CLK, SYNC_CLK, and SYNC according to another modification example of the first embodiment.

FIG. 8 illustrates SYNC_CLK(A6) and SYNC_CLK (A13) to SYNC_CLK (A17), and SYNC(A6) and SYNC (A13) to SYNC(A17) as examples of SYNC_CLK and SYNC. SYNC(A6) and SYNC(A13) to SYNC(A17) all have the same cycle h. That is, h_6=h_13= h_14= . . . =h_17=k (t_s/2)+4t.

The SYNC_CLK (A13) has the L period length of 5t once in one cycle of SYNC and has the H period length of 5t once in one cycle of SYNC.

SYNC_CLK (A14) has an L period length of 5t twice in one cycle of SYNC.

SYNC_CLK (A15) has an H period length of 5t twice in one cycle of SYNC.

SYNC_CLK (A16) has an L period length of 4t twice in one cycle of SYNC and has the H period length of 4t twice in one cycle of SYNC.

SYNC(A17) has cycle lengths of (k+1) waves of SYNC_CLK. That is, SYNC(A17) has one more wave (half-cycle period) of SYNC_CLK than SYNC(A1) during a cycle of SYNC.

SYNC_CLK (A17) has an L period length of 2t and a H period length of 2t just once in one cycle of SYNC. That is, SYNC_CLK (A17) has an L period shorter than the half cycle (t_s/2) of SYNC_CLK by t once and also has an H period shorter than the half cycle (t_s/2) of SYNC_CLK by t once.

In some examples, SYNC_CLK may have an L period or an H period longer or shorter than the standard half cycle length of the SYNC_CLK three times or more in one cycle of SYNC.

In the first embodiment described above, the setting value n is a value obtained by rounding off n_i. However, the setting value n may be a value obtained by rounding n_i by another method such as rounding down or rounding up.

The length of each L period of each SYNC illustrated in FIG. 6 to FIG. 8 corresponds to two cycles of SYNC_CLK. However, the length of the L period of the SYNC signals is not limited thereto.

In the first embodiment described above, the image forming apparatus 100 uses the second H in the SYNC signal as a light emission trigger. However, the light emission trigger may instead be the first H, the third H or higher, or may be an L value instead of an H value.

In some examples, SYNC may have the L and H periods opposite to L and H periods of the embodiment described above. Similarly, SYNC_CLK may have L periods and H periods opposite to the L periods and H periods of the example embodiment described above. Likewise, the internal CLK may have L and H values opposite to L and H value of the example embodiment described above.

Second Embodiment

A configuration of the image forming apparatus 100 according to a second embodiment is the same as the configuration of the first embodiment, and thus, description thereof will be omitted.

Figure 9:
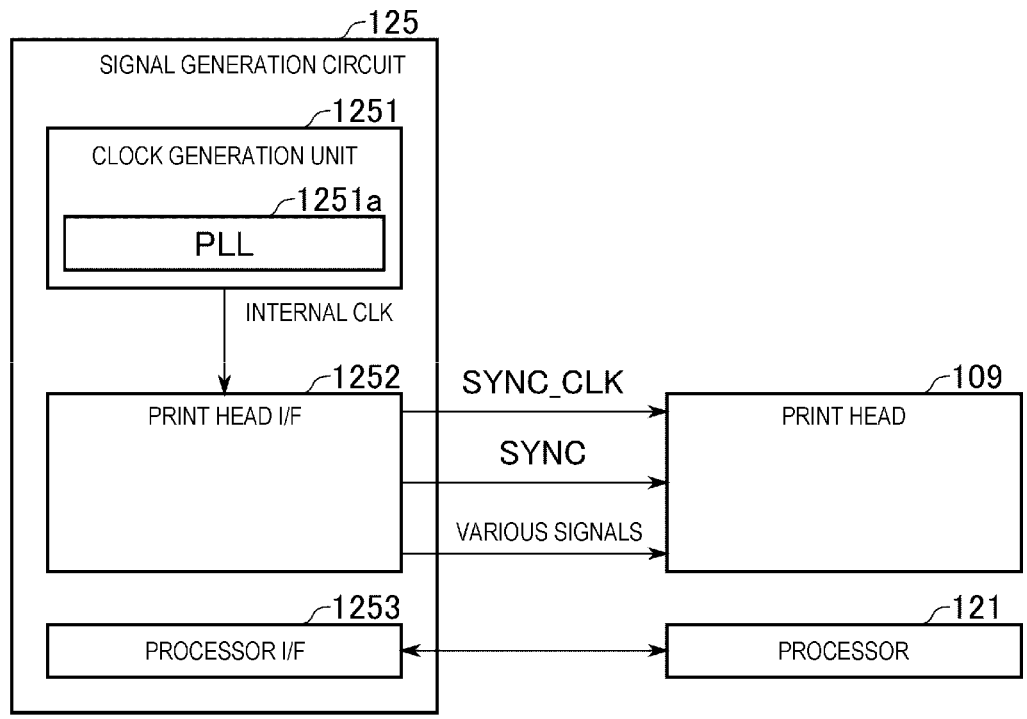
FIG. 9 is a block diagram of aspects related to a signal generation circuit according to a second embodiment.

However, the clock generation unit 1251 of the image forming apparatus 100 according to the second embodiment includes a phase locked loop (PLL) 1251a illustrated in FIG. 9. FIG. 9 is a block diagram illustrating a signal generation circuit according to the second embodiment similar to that depicted in FIG. 3.

The PLL 1251a is also called a phase locked loop circuit. The PLL 1251a is a circuit that finely adjusts the internal CLK frequency generated by the clock generation unit 1251. The PLL 1251a can increase or decrease the internal CLK frequency, for example, on a per 0.001% basis. Further, the PLL 1251a may be capable of increasing or decreasing the internal CLK frequency within a range of, for example, approximately 3% at maximum. Here, it is assumed that a rate at which the PLL 1251a increases the internal CLK frequency is referred to as a fine adjustment rate. Therefore, the PLL 1251a has, for example, a fine adjustment rate resolution of 0.001% and a fine adjustment rate range of −3% to +3%. The image forming apparatus 100 adjusts the internal CLK frequency such that the frequency of SYNC_CLK falls within a frequency range that can be input to a print head.

The print head I/F 1252 according to the second embodiment does not have a function of changing the lengths of the L period and the H period.

Figure 10:
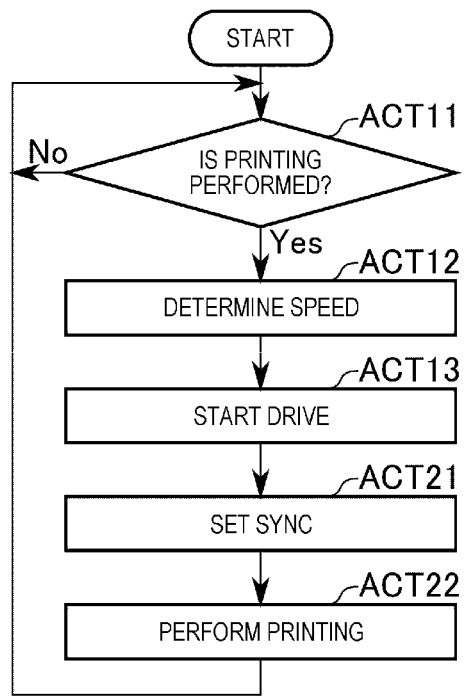
FIG. 10 is a flowchart illustrating an example of a process performed by the processor according to the second embodiment.

Hereinafter, an operation of the image forming apparatus 100 according to the second embodiment will be described with reference to FIG. 10. Content of a process in the following description on the operation is an example, and various processes that can obtain the same result can be appropriately used. FIG. 10 is a flowchart illustrating an example of a process performed by the processor 121 of the image forming apparatus 100, according to the second embodiment. The processor 121 performs this process based on a program stored in, for example, the ROM 122, the auxiliary storage device 124, or the like.

In the second embodiment, the processor 121 proceeds to Act 21 after a process of Act 13 of FIG. 10.

In Act 21, the processor 121 sets an internal CLK frequency and a SYNC cycle. Here, for example, setting of the SYNC cycle will be described here by taking a case of the following conditions as an example.

Internal CLK reference frequency f_c0: 120 [MHz]
Division ratio N: 6
SYNC_CLK reference frequency f_s0: 20 [MHz]
Process speed v: 215 [mm/sec]
Resolution r in a sub-scan direction: 2400 [dpi]

Here, the internal CLK reference frequency f_c0 is the internal CLK frequency when no adjustment is made by the PLL 1251a. Furthermore, SYNC_CLK reference frequency f_s0 is the frequency of the SYNC_CLK when no adjustment is made by the PLL 1251a.

An interval d in the sub-scan direction in the second embodiment is the same as in the first embodiment.

$$d=(1/r)[\text{in}(\text{inch})]\approx 10.58333\ [\mu m] \tag{27}$$

The ideal value h_i of the SYNC cycle according to the second embodiment is the same as in the first embodiment.

$$h\_i=(d/v)\approx 49.22481\ [\mu\text{sec}] \tag{28}$$

The cycle t_s of SYNC_CLK is the resolution of a SYNC cycle h_B in the second embodiment. Therefore, $$h\_B=(n\_B\cdot t\_s) \tag{29}$$

That is, the SYNC cycle h_B is a multiple of the cycle t_s. In this context, n_B indicates a setting value of the second embodiment. The setting value n_B [dec] must be a natural number.

Figure 11:
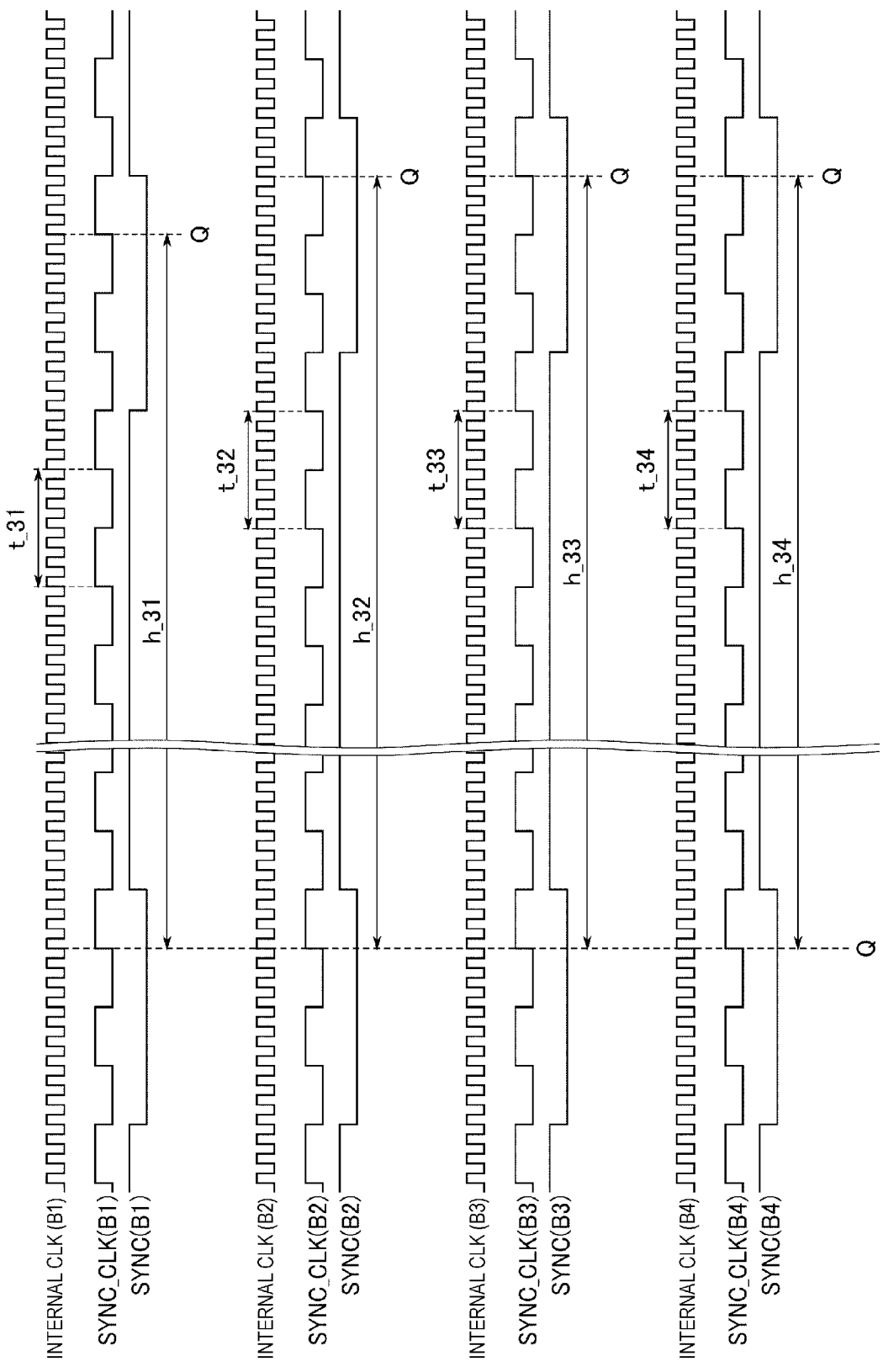
FIG. 11 is a timing chart illustrating an example of internal CLK, SYNC_CLK, and SYNC according to the second embodiment.

FIG. 11 is a timing chart illustrating examples of the internal CLK, SYNC_CLK, and SYNC according to the second embodiment. FIG. 11 illustrates four different waveform examples referred to, from top to bottom of the figure, as a first waveform example, a second waveform example, a third waveform example, and a fourth waveform example.

First Waveform Example

The first waveform example includes internal CLK(B1), SYNC_CLK(B1), and SYNC(B1) when the internal CLK frequency is set to f_c0. That is, the first waveform example includes the internal CLK, SYNC_CLK, and SYNC when no adjustment is made by the PLL 1251a, and thus, the first waveform example has the same waveforms as the internal CLK, SYNC_CLK, and SYNC of an image forming apparatus of the related art.

A SYNC_CLK(B1) cycle t_31 is as follows:

$$t\_31=(1/f\_s0)=0.05\ [\mu\text{sec}] \tag{30}$$

If a SYNC(B1) cycle h_31 is represented as:

$$h\_31=(n\_31\cdot t\_31) \tag{31},$$

$$n\_31=\text{floor}((h\_i/t\_31)+0.5)=984 \tag{32}$$

Here, n_31 indicates the setting value n_B for the first waveform example. Therefore, the SYNC(B1) cycle h_31 is 49.2 [μsec]. Therefore, an error e_L31 between the cycle h_31 and the cycle h_i becomes as follows:

$$e\_L31=h\_31-h\_i=\text{approximately } 0.02481\ [\mu\text{sec}]$$

Further, a percentage error e_p31 is represented:

$$e\_p31=(1-(h\_31/h\_i))\times 100\approx -0.078802[\%] \tag{33}$$

Then, the color shift amount g_32 for 25512 lines is:

$$g\_32=(d\cdot e\_p32)/100\times 25512\approx -136.13\ [\mu m] \tag{34}$$

Second Waveform Example

The second waveform example shows internal CLK(B2), SYNC_CLK(B2), and SYNC(B2) when the internal CLK frequency is adjusted to bring the SYNC cycle closer to h_i. The setting value n_32 of the second waveform example is the same as n_31 of the first waveform example.

$$n\_32=n\_31=\text{floor}((h\_i/t\_31)+0.5)=984 \tag{35}$$

If the SYNC(B2) cycle h_32 is set to a value larger than the cycle h_31 by p_i [%], the cycle h_32 can have the same length as the cycle h_i. The value P_i at this time is as follows:

$$p\_i=((h\_i/h\_31)-1)\times 100=0.0504 \tag{36}$$

The PLL 1251a of this example can change the internal CLK frequency with a resolution of 0.001%. That is, the fine adjustment rate p_32 [%] of the second waveform example will be a multiple of 0.001 [%]. Since p_32 preferably has a value as close as possible to p_i, for example, p_32=−0.050. The PLL 1251a can bring the cycle h_32 closer to the cycle h_i by changing the internal CLK frequency by the fine adjustment rate p_32. The cycle h32 at this time is:

$$h\_32=h\_31\times(1+(p\_32/100))=49.2246\ [\mu\text{sec}] \tag{37}$$

Therefore, an error e_L32 between the cycle h_32 and the cycle h_i is:

$$e\_L32=h\_32-h\_i=\text{approximately } 0.00021\ [\mu\text{sec}]$$

The percentage error e_p32 is:

$$e\_p32=(1-(h\_32/h\_i))\times 100\approx 0.000427[\%] \tag{38}$$

Thus, the color shift amount g_32 for 25512 lines is:

$$g\_32=(d\cdot e\_p32)/100\times 25512\approx 1.152\ [\mu m] \tag{39}$$

Furthermore, the frequency f_c32 of internal CLK(B2), the frequency f_s32 of SYNC_CLK (B2), and the cycle t_32 of SYNC_CLK (B2) are respectively:

$$f\_c32=f\_c0\times(100+p\_32)\div 100=119.94\ [\text{MHz}] \tag{40}$$

$$f\_s32=f\_c32\div 6=19.99\ [\text{MHz}] \tag{41}$$

$$t\_32=t\_31\times(100+p\_32)\div 100=0.050025\ [\mu\text{sec}] \tag{42}$$

As described above, the processor 121 thus determines that p_32=−0.050 and n_32=984 in the second waveform example.

Third Waveform Example

The third waveform example shows internal CLK(B2), SYNC_CLK(B2), and SYNC(B2) when the internal CLK frequency and the setting value n_B are adjusted to bring the SYNC cycle closer to h_i. However, the third waveform example shows an example in which the internal CLK frequency is made longer than the internal CLK reference frequency f_c0. Therefore, a fine adjustment rate p_3 in the waveform example 3 is a positive value.

The processor 121 determines a setting value n_33 and an internal CLK frequency f_c33 of the third waveform example by using, for example, the table T1 illustrated in FIG. 12. FIG. 12 is a diagram illustrating an example of a table for determining the setting value and the internal CLK frequency. Some parts of such a table are omitted in the illustration of FIG. 12. The image forming apparatus 100 stores, for example, the table T1 in the auxiliary storage device 124.

Respective values of internal frequencies in the table T1 are examples of first values. Respective values of setting values in the table T1 are examples of second values. Therefore, the auxiliary storage device 124 that stores the table T1 is an example of a storage unit that stores color shift amounts for each of a plurality of combinations of the internal frequencies and the setting values.

The table T1 shows values for each of the internal CLK frequency f_c, the SYNC_CLK frequency f_s, the SYNC_CLK resolution (cycle t), the process speed v, the resolution r, the interval d, the SYNC cycle ideal value h_i, the SYNC cycle resolution, the setting value n_B, the SYNC cycle h, the error e_p, the drum interval, the color shift amount g, and the like when the fine adjustment rate p is changed by 0.001%, which is a resolution of the fine adjustment rate. Some of these values are fixed regardless of the fine adjustment rate. Therefore, the image forming apparatus 100 may store such fixed values in a place different from the table T1. Furthermore, the table T1 is a table showing a case in which the fine adjustment rate is a positive value.

The processor 121 sets the fine adjustment rate at which the color shift amount g is the least as a fine adjustment rate p_3 in the third waveform example by reference to the table T1. Alternatively, the processor 121 selects, from the table T1, the fine adjustment rate at which the color shift amount g is equal to or less than a predetermined threshold T_1 as the fine adjustment rate p_3 in the third waveform example. When there are a plurality of fine adjustment rates for which the color shift amount g is equal to or less than the predetermined threshold, the processor 121 sets, for example, the smallest fine adjustment rate as the fine adjustment rate p_3.

Therefore, the processor 121 selects the fine adjustment rate 55.9 at which the color shift amount is closest to 0 as a value of the fine adjustment rate p_3. The color shift amount at a fine adjustment rate of 55.9 is approximately 0.147993.

Furthermore, the processor 121 selects the setting value n_B corresponding to the fine adjustment rate p_3 as a setting value n_B3 in the third waveform example by reference to the table T1.

Therefore, the processor 121 determines a setting value 990 corresponding to the fine adjustment rate of 55.9% as a value of a setting value n_B4.

As described above, the processor 121 determines that p_3=55.9 [%] and n_B3=990 for the third waveform example.

Fourth Waveform Example

The fourth waveform example shows internal CLK(B2), SYNC_CLK(B2), and SYNC(B2) when the internal CLK frequency and the setting value n are adjusted to bring the SYNC cycle closer to h_i. However, the fourth waveform example is different from the third waveform example in that the internal CLK frequency is lowered to bring the SYNC cycle close to h_i. Therefore, a fine adjustment rate p_4 in the fourth waveform example is a negative value.

The processor 121 determines a setting value n_34 of the fourth waveform example and an internal CLK frequency f_c34 by using, for example, the table T2 illustrated in FIG. 13. FIG. 13 is a diagram illustrating an example of a table for determining the setting value and the internal CLK frequency. Some parts of such a table are omitted in the illustration of FIG. 13. The image forming apparatus 100 stores the table T2 in the auxiliary storage device 124, for example.

Each value of the internal frequencies in the table T2 are examples of first values. Further, each value of the setting values in the table T2 are examples of second values. Therefore, the auxiliary storage device 124 that stores the table T2 is an example of a storage unit.

The table T2 shows each of the internal CLK frequency f_c, the SYNC_CLK frequency f_s, the SYNC_CLK resolution (cycle t), the process speed v, the resolution r, the interval d, the SYNC cycle ideal value h_i, the SYNC cycle resolution, the setting value n_B, the SYNC cycle h, the error e_p, the drum interval, the color shift amount g, and the like when the fine adjustment rate p is changed by 0.001%, which is the resolution of the fine adjustment rate. Some of these values are fixed regardless of the fine adjustment rate. Therefore, the image forming apparatus 100 may store these fixed values in a place different from the table T2. The table T2 is a table showing a case in which the fine adjustment rate is a negative value.

The processor 121 determines, by reference to the table T2, the fine adjustment rate value at which the color shift amount g is the least and then set this value as the fine adjustment rate p_4 in the fourth waveform example. Alternatively, the processor 121 can determine, from the table T2, a fine adjustment rate at which the color shift amount g is equal to or less than the predetermined threshold T_2 and then set this rate as the fine adjustment rate p_4 in the fourth waveform example. When there are a plurality of fine adjustment rates for which the color shift amount g is equal to or less than a predetermined threshold, the processor 121 selects the largest fine adjustment rate among them as the fine adjustment rate p_4.

Therefore, the processor 121 determines, for example, a fine adjustment rate −15.2 as the value for which the color shift amount is closest to 0 and set this value as the fine adjustment rate p_4. The color shift amount at the fine adjustment rate of 15.2 is approximately 0.08517.

Furthermore, the processor 121 determines the setting value n_B corresponding to the fine adjustment rate p_4 as the setting value n_B4 in the fourth waveform example by reference to the table T2.

Therefore, the processor 121 determines a setting value 983 corresponding to the fine adjustment rate −15.2% as a value of the setting value n_B4.

As described above, the processor 121 determines that p_4=−15.2 [%] and n_B4=983 by reference to the table T2.

The image forming apparatus 100 may be able to change the process speed v. In this case, the image forming apparatus 100 stores tables such as the table T1 and the table T2 for each process speed setting.

Furthermore, the processor 121 can determine whether a fine adjustment rate is a positive value or a negative value as in either scenario (i) or (ii) below.

(i) The image forming apparatus 100 has previously determined whether a fine adjustment rate is to be a positive value or a negative value. Therefore, the processor 121 determines the fine adjustment rate by using either the table T1 or the table T2.

(ii) The processor 121 obtains both a positive fine adjustment rate and a negative fine adjustment rate by reference to the tables T1 and T2. Then, the processor 121 selects either the obtained positive fine adjustment rate or the obtained negative fine adjustment rate as a fine adjustment rate to be used for setting the internal CLK frequency based on some selection criterion. For example, the processor 121 selects the fine adjustment rate with the smaller absolute value as the fine adjustment rate used for setting the internal CLK frequency. Alternatively, the processor 121 selects the fine adjustment rate providing the lesser color shift amount as the fine adjustment rate used for setting the internal CLK frequency.

The processor 121 sets the internal CLK frequency by transmitting the fine adjustment rate, determined as described above, to the clock generation unit 1251. The fine adjustment rate transmitted from the processor 121 is input to the signal generation circuit 125 via the processor I/F 1253. Further, the fine adjustment rate input to the clock generation unit 1251.

The clock generation unit 1251 generates the internal CLK based on the fine adjustment rate.

The processor 121 sets the SYNC cycle by transmitting the setting value n, determined as described above, to the signal generation circuit 125. The setting value n transmitted from the processor 121 is input to the signal generation circuit 125 via the processor I/F 1253. Further, the setting value n is input to the print head I/F 1252.

The print head I/F 1252 generates SYNC_CLK and SYNC based on the setting value n.

In Act 22, the processor 121 performs printing based on a print job or the like, similar to Act 15 of the first embodiment. However, in the present embodiment, the print head I/F 1252 outputs SYNC_CLK and SYNC as generated based on the setting performed in Act 21 and inputs these SYNC_CLK and SYNC to the print head 109. FIG. 12 and FIG. 13 illustrate timing Q that triggers light emission. After the process of Act 22, the processor 121 returns to Act 11.

According to the image forming apparatus 100 of the second embodiment, the signal generation circuit 125 can change a SYNC_CLK frequency and a SYNC cycle by changing a fine adjustment rate. Thereby, the signal generation circuit 125 can reduce a color shift amount as compared with the related art.

Further, according to the image forming apparatus 100 of the second embodiment, the signal generation circuit 125 can change the fine adjustment rate and a setting value. Thereby, the signal generation circuit 125 can reduce the color shift amount as compared with changing only the fine adjustment rate.

Further, the image forming apparatus 100 according to the second embodiment determines a fine adjustment rate and a setting value by using a table. Therefore, the image forming apparatus 100 can set the internal CLK frequency and the SYNC cycle faster than obtaining the fine adjustment rate and the setting value by calculation.

The image forming apparatus 100 according to the second embodiment determines a combination of a fine adjustment rate and a setting value for which a color shift amount is equal to or less than a threshold as a combination of a fine adjustment rate and a setting value used for setting the internal CLK frequency and the SYNC cycle by reference to a table. Thereby, the image forming apparatus 100 can reduce the color shift amount.

The image forming apparatus 100 according to the second embodiment may reduce a color shift amount somewhat more than the first embodiment. However, the image forming apparatus 100 according to the first embodiment may take less time to set the SYNC cycle than the second embodiment.

The second embodiment described above can also be modified as follows.

In the third waveform example and the fourth waveform example of the second embodiment described above, the processor 121 obtains a fine adjustment rate and a setting value by using tables such as the table T1 and the table T2. However, the processor 121 may instead obtain the fine adjustment rate and the setting value by calculation.

In the second waveform example of the second embodiment, the processor 121 calculates the fine adjustment rate and the setting value by calculation or the like. However, the processor 121 may obtain the fine adjustment rate and the setting value instead by using a table.

The auxiliary storage device 124 may store a color shift amount for each of a plurality of combinations of an internal frequency and a setting value by using other methods using a table or the like.

The first and second embodiments described above can also be modified as follows.

The image forming apparatus 100 may be capable of performing both the operation illustrated for the first embodiment and the operation illustrated for the second embodiment.

The processor 121 may realize a part or all of the processes performed by the program in the above-described embodiments with a hardware configuration of a circuit.

The image forming apparatus 100 according to the embodiments described above can be transferred to, for example, an administrator or the like of the image forming apparatus 100 with a program for performing the above processing already stored therein. Alternatively, the image forming apparatus 100 can be transferred to the administrator or the like without the program is stored therein. In such a case, the program may be separately transferred to the administrator or the like and then stored in the image forming apparatus 100 based on an operation by the administrator, a service person, or the like. The transfer of the program can be realized, for example, by using a removable storage medium, such as a disk medium or a semiconductor memory, or by downloading via the Internet or the LAN.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal generation circuit, comprising:
a generation unit configured to generate a second clock signal by division of a first clock signal and generate a timing signal with a cycle length that is a sum of a set number of cycle lengths of the second clock signal;
a change unit configured to adjust a frequency of the first clock signal to change the cycle lengths of the second clock signal to change the cycle length of the timing signal; and
an output unit configured to output the second clock signal and the timing signal.

2. The signal generation circuit according to claim 1, wherein the change unit includes a phase locked loop circuit.

3. The signal generation circuit according to claim 1, wherein the change unit is further configured to change the set number of cycle lengths to change the cycle length of the timing signal.

4. The signal generation circuit according to claim 1, further comprising:
a control unit configured to set the frequency of the first clock signal and the set number.

5. The signal generation circuit according to claim 4, wherein the control unit sets the frequency of the first clock signal and the set number by selecting from a table according to a threshold color shift amount.

6. An image forming apparatus, comprising:
a print head for forming an image of a recording medium; and
a signal generation circuit providing signals to the print head for forming the image on the recording medium, the signal general circuit including:
- a clock generation circuit configured to generate an internal clock signal; and
- a print head interface circuit including:
  - a generation unit configured to generate a second clock signal from division of the internal clock signal and generate a timing signal with a cycle length that is a sum of a predetermined number of half-cycle periods of the second clock signal;
  - a period changing unit configured to adjust the cycle length of the timing signal by changing a length of at least one half-cycle period of the second clock signal; and
  - an output unit configured to output the second clock signal and the timing signal to the print head.

7. The image forming apparatus according to claim 6, wherein the period changing unit adjusts the cycle length of the timing signal by changing an H period length or an L period length of one half-cycle period.

8. The image forming apparatus according to claim 6, wherein the period changing unit changes just one H period length or L period length in a cycle of the timing signal.

9. The image forming apparatus according to claim 6, wherein the period changing unit adjusts the cycle length of the timing signal by changing an L period length of one half-cycle period.

10. The image forming apparatus according to claim 6, wherein the period changing unit adjusts the cycle length of the timing signal by changing some but not all L period lengths of half-cycle periods of the second clock signal.

11. The image forming apparatus according to claim 6, wherein the period changing unit adjusts the cycle length of the timing signal by changing an H period length of one half-cycle period.

12. The image forming apparatus according to claim 6, wherein the period changing unit adjusts the cycle length of the timing signal by changing some but not all H period lengths of half-cycle periods of the second clock signal.

13. The image forming apparatus according to claim 6, further comprising:
a control unit configured to control the printer interface circuit to the cycle length of the timing signal according to a print process speed.

14. A signal generation circuit, comprising:
- a generation unit configured to generate a second clock signal from division of a first clock signal and generate a timing signal with a cycle length that is a sum of a predetermined number of half-cycle periods of the second clock signal;
- a period changing unit configured to adjust the cycle length of the timing signal by changing a length of at least one half-cycle period of the second clock signal; and
- an output unit configured to output the second clock signal and the timing signal.

15. The signal generation circuit according to claim 14, wherein the period changing unit adjusts the cycle length of the timing signal by changing an H period length or an L period length of one half-cycle period.

16. The signal generation circuit according to claim 14, wherein the period changing unit changes just one H period length or L period length in a cycle of the timing signal.

17. The signal generation circuit according to claim 14, wherein the period changing unit adjusts the cycle length of the timing signal by changing an L period length of one half-cycle period.

18. The signal generation circuit according to claim 14, wherein the period changing unit adjusts the cycle length of the timing signal by changing some but not all L period lengths of half-cycle periods of the second clock signal.

19. The signal generation circuit according to claim 14, wherein the period changing unit adjusts the cycle length of the timing signal by changing an H period length of one half-cycle period.

20. The signal generation circuit according to claim 14, wherein the period changing unit adjusts the cycle length of the timing signal by changing some but not all H period lengths of half-cycle periods of the second clock signal.

* * * * *